US006750524B2

(12) United States Patent
Parthasarthy et al.

(10) Patent No.: US 6,750,524 B2
(45) Date of Patent: Jun. 15, 2004

(54) TRENCH MOS RESURF SUPER-JUNCTION DEVICES

(75) Inventors: Vijay Parthasarthy, Phoenix, AZ (US); Vishnu Khemka, Scottsdale, AZ (US); Ronghua Zhu, Chandler, AZ (US); Amitava Bose, Tempe, AZ (US)

(73) Assignee: Motorola Freescale Semiconductor, Schaumburg, IL (US)

( * ) Notice: Subject to any disclaimer, the term of this patent is extended or adjusted under 35 U.S.C. 154(b) by 4 days.

(21) Appl. No.: 10/145,524

(22) Filed: May 14, 2002

(65) Prior Publication Data

US 2003/0214009 A1 Nov. 20, 2003

(51) Int. Cl.[7] .............................................. H01L 23/58
(52) U.S. Cl. ...................... 257/492; 257/328; 257/493
(58) Field of Search ................................ 257/492, 493, 257/328

(56) References Cited

U.S. PATENT DOCUMENTS

| 5,216,275 | A | | 6/1993 | Chen .......................... 257/493 |
| 6,525,372 | B2 | * | 2/2003 | Baliga ......................... 257/328 |
| 6,590,240 | B1 | * | 7/2003 | Lanois ......................... 257/256 |
| 6,611,021 | B1 | * | 8/2003 | Onishi et al. ................. 257/328 |
| 2002/0125527 | A1 | * | 9/2002 | Blanchard .................... 257/328 |
| 2002/0177277 | A1 | * | 11/2002 | Baliga ......................... 438/268 |
| 2003/0073287 | A1 | * | 4/2003 | Kocon ......................... 438/259 |

FOREIGN PATENT DOCUMENTS

WO  WO 00/33385  6/2000

OTHER PUBLICATIONS

Chen, Xing–Bi, et al., "Optimization of the Specific On–Resistance of the COOLMOS™," IEEE Transactions on Electron Devices, vol. 48, No. 2, Feb. 2001 (Feb. 2001), pp. 344–348, XP001038980, IEEE, New York, NY.

Sheng, K., Udrea, F., Amaratunga, G.A.J., "Double Gate 3D AC Switch," *Proceedings of the European Solid–State Device Research Conference (ESSDERC)*, 2001, pp. 407–410.

Deboy, G., et al., "Compensation Devices Versus Power MOS and High Speed IGBT–A Device Physics Based Guideline for the Application," In: 31th European SolidState Device Research Conference, Nurnberg, Germany, Sep. 11–13, 2001 (Sep. 17, 2001), Hrsg.: Ryssel, H.; Wachutka, G.; Grunbacher, H.; Bonchamp–Les–Laval: Frontier Group, 2001, S. 61–68.

Ludikhuize, Adriaan W., "Performance and Innovative Trends in RESURF Technology," ESSDERC –2001; 31th Eur. Solid–State device Res. Conf. (Nuremberg), 35–42, 2001.

Ludikhuize, Adriaan W., "A Review of RESURF Technology," IEEE May 22–May 25, 2000, pp. 11–18.

Udrea, F., Popescu, A. & Milne, W.I., "3D RESURF Double–Gate MOSFET: A Revolutionary Power Device Concept," *Electronics Letters*, Apr. 16, 1998, vol. 34, No. 8, pp. 808–809.

Deboy, G., et al., "A Comparison of Modern Power Device concepts for High Voltage Applications: Field Stop IGBT, Compensation Devices and SiC Devices," 2000 IEEE Bipolar/BicMOS Circuits and Technology meeting pp. 134–141.

Fujihira, Tatsuhiko, "Theory of Semiconductor Superjunction Devices," Jpn.J. Appl. Phys., vol. 36 (1997), Pt. 1, No. 10, Oct. 1997; pp. 6254–6262.

* cited by examiner

Primary Examiner—Richard Elms
Assistant Examiner—Christian D. Wilson
(74) Attorney, Agent, or Firm—John A. Fortkort; Hulsey Grether + Fortkort LLP

(57) ABSTRACT

A RESURF super-junction device (51) is provided which comprises a plurality of electrodes (53) disposed in a layer of a first material (61) having a first conductivity type. Each of the plurality of electrodes contains a second material (57) of a second conductivity type which is encased in a dielectric material (55).

16 Claims, 5 Drawing Sheets

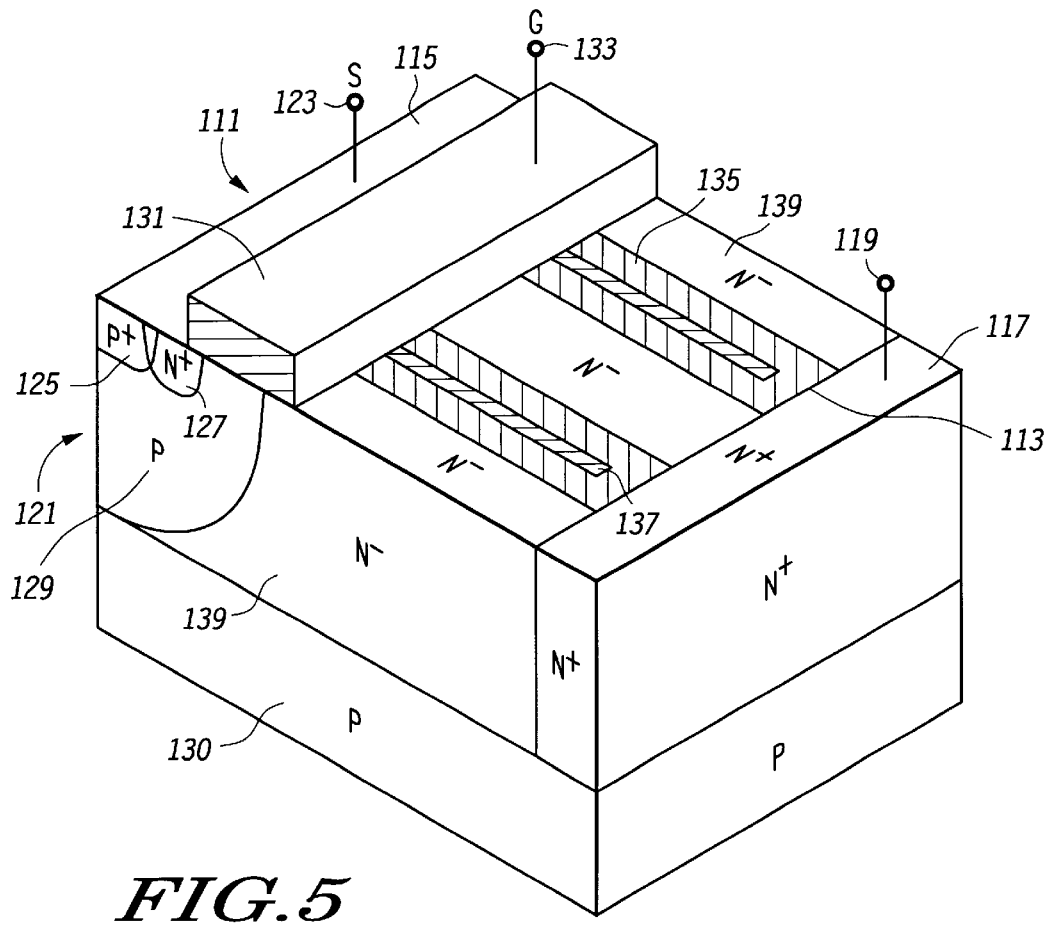
*FIG.5*
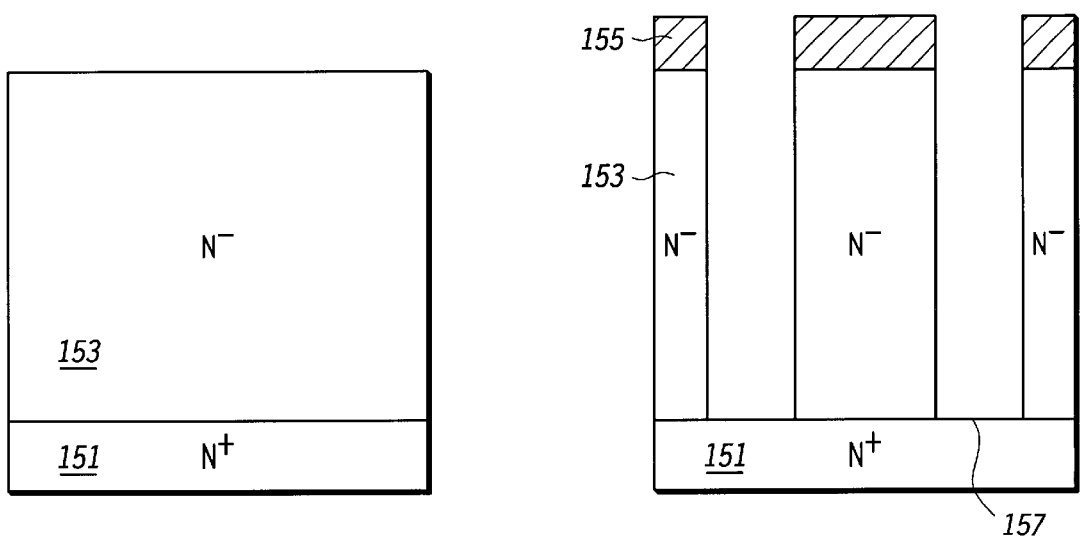
*FIG.6*  *FIG.7*

TRENCH MOS RESURF SUPER-JUNCTION DEVICES

FIELD OF THE INVENTION

The present invention relates generally to MOS RESURF super-junction devices.

BACKGROUND SECTION

FIG. 1 illustrates a conventional vertical power MOSFET. The device 1 consists of an N+ substrate 3 on which an epitaxial N− layer defining a drift region 5 has been grown. In the particular device shown, the source regions 7, each of which consists of a P+ layer 9 equipped with N+ implant regions 11, are separated by a trench 13. The trench is lined with a gate oxide 15 over which is disposed a gate metallization layer 17. Each source region is likewise equipped with a source metallization layer 19, and the N+ substrate is equipped with a drain metallization layer 21.

It is generally desirable in a power MOSFET device of the type shown in FIG. 1 to achieve both a high breakdown voltage (BV) and a low on-resistance ($R_{ON}$). However, both of these parameters depend on the thickness and resistivity of the drift region in such a way that both the breakdown voltage and the $R_{ON}$ of a power MOSFET device will increase as the dopant concentration in the drift region is decreased and/or the thickness of the drift region is increased. There is thus a trade-off in power MOSFETs between breakdown voltage and $R_{ON}$.

One way of reducing the specific on-resistance of a power MOSFET device without compromising the desired high breakdown voltage is through Reduced Surface Field (RESURF) technology. In a RESURF device, such as the RESURF lateral MOSFET 120 shown in FIG. 12, an additional layer 132 (additional to 10 alone) of silicon doped with P- type impurities is provided underneath the N- drift region 114 of the device (the polarities would be reversed for a device having a P- drift region). This additional layer 132 is the RESURF region. The RESURF MOSFET 120 can have the same breakdown voltage as, and a lower specific on-resistance than, the simple MOSFET 110 due to the extra depletion of electrons that occurs from the drift region of the RESURF MOSFET when the device is in its off state. This extra depletion occurs as a result of the interaction of the drift region 114 with the RESURF region 132, in addition to the normal depletion that occurs as a result of the interaction of the drift region and the source region 112.

The extra depletion within the RESURF MOSFET 120 reduces the maximum electric field that occurs at any point within the drift region. Specifically, given the application of the same voltage between the drain region 116 and source region 112 of the RESURF MOSFET 120 as assumed with respect to the simple MOSFET 110 (where both MOSFETs have drift regions of equal dimensions), the resulting electric field within the drift region 114 is lower at the junction 118 for the RESURF MOSFET than for the simple MOSFET. With the addition of the RESURF region 132 to the simple MOSFET to create the RESURF MOSFET 120, therefore, a greater voltage must be applied between the drain region 116 and source region 112 of the MOSFET to produce a maximum electric field that exceeds the critical level above which breakdown occurs than for the simple MOSFET 110. Consequently, a RESURF MOSFET can have a smaller drift region 114, both in terms of the length of the drift region between the drain region 116 and source region 112 and in terms of the depth or thickness of the drift region, or a higher doping level than a comparable simple MOSFET having the same breakdown voltage. Since, as noted above, the $R_{ON}$ of a power MOSFET device will increase as the dopant concentration in the drift region is decreased and/or the thickness of the drift region is increased, this means that a RESURF MOSFET can have a lower $R_{ON}$ than a comparable simple MOSFET having the same breakdown voltage.

Super-junction RESURF technology has now evolved as a means to even further improve the breakdown voltage versus $R_{ON}$ trade-off in vertical power MOSFETS. One example of a conventional super-junction RESURF device is illustrated in FIG. 2. This device 31 is similar in many respects to the device depicted in FIG. 1, the principle difference (aside from the fact that the device of FIG. 2 is a vertical device) being that, while the device of FIG. 1 has a homogeneous drift region, the drift region 33 of the power device of FIG. 2 is divided into a plurality of N− regions 35 which alternate with P− regions 37. Such an arrangement allows for the doping concentration of the N+ 41 and P+ 35 regions to be increased significantly without compromising the breakdown voltage. Accordingly, this arrangement results in a significant reduction in $R_{ON}$ for a given breakdown voltage, hence greatly improving the breakdown voltage versus $R_{ON}$ trade-off.

Although the device depicted in FIG. 2 is advantageous in terms of the breakdown voltage versus $R_{ON}$ trade-off that it affords, this type of device is inherently difficult to manufacture on a commercial scale, a fact that has hindered the commercial deployment of RESURF super-junction technology. In particular, in order to realize the full potential of these devices, the vertically oriented N−/P− stripes or regions need to be very narrow and deep and accurately aligned, a result that is very difficult to accomplish with a single epitaxial layer growth and implantation cycle. Consequently, most experimental embodiments reported to date have been fabricated through multiple epitaxial and high-energy implantation steps. However, the use of such multiple processing steps greatly increases the process complexity and places very high demands on feature alignment at each step. Moreover, since there are several steps involved in this type of approach, and since a defect in any of the vertically oriented drift regions will result in a defective device, the product yield afforded by this type of approach is very low.

There is thus a need in the art for a MOS RESURF super-junction device, and a method for making the same, in which alignment dependence is minimized or eliminated, and in which process complexity is reduced. There is also a need in the art for a method for making a MOS RESURF device that affords a high product yield. These and other needs are provided by the devices and methodologies disclosed herein, as hereinafter described.

SUMMARY OF THE INVENTION

In one aspect, a RESURF super-junction device is provided herein which comprises a plurality of electrodes disposed in a layer of a first material having a first conductivity type. Each of the plurality of electrodes contains a second material of a second conductivity type which is encased or encapsulated in a dielectric material.

In another aspect, a RESURF super-junction device is provided herein which comprises an alternating sequence of first and second regions, wherein each of the first regions comprises a material having a first conductivity type, wherein each of the second regions comprises a trench containing a material having a second conductivity type which is separated from the first material by a dielectric layer, and wherein the first regions collectively define the drift region of the device.

In still another aspect, a RESURF super-junction device is provided herein which comprises a P+ region, an N+ region, and a drift region comprising a plurality of N− regions, wherein any two of said plurality of N− regions have at least one polysilicon/oxide trench disposed between them.

In yet another aspect, a method is provided herein for making a RESURF super-junction device. In accordance with the method, a substrate is provided which has a first conductivity type. A plurality of trenches are created in the substrate, as, for example, through masking and etching steps, and a dielectric layer is deposited onto the interior surface of each trench. A material of a second conductivity type is then deposited over the dielectric layer.

In the above noted aspects, the devices may be vertical or lateral devices or MOSFETs. The regions of first and second conductivity type may be p-conductors or nconductors. The electrode or trench regions may utilize various conductive materials, including doped or undoped polysilicon and various metals, and may also utilize various dielectric materials, such as silicon oxide or silicon nitride. These devices may also include one or more source and body regions, which are preferably disposed over or adjacent to the trench regions or electrodes.

BRIEF DESCRIPTION OF THE DRAWINGS

FIGS. 3–5 are illustrative diagrams of RESURF super-junction devices in accordance with the teachings herein;

FIGS. 6–10 illustrate one possible fabrication route for a RESURF superjunction device in accordance with the teachings herein;

DETAILED DESCRIPTION

It has now been found that the above noted infirmities can be avoided through the use of trench technology to form RESURF super-junction devices. Trench technology currently exists which allows trenches to be formed in a semiconductor substrate with a very high degree of precision and uniformity. This technology can be applied to the fabrication of MOS RESURF devices to provide a highly reliable fabrication route for these devices. In particular, trench technology can be applied to form MOS RESURF devices such as, for example, Bipolar Junction Transistors (BJTs), Insulated Gate Bipolar Transistors (IGBTs), thyristors, and diodes, in which the P− regions found in conventional RESURF super-junction devices have been replaced with trench regions having an electrode that is encapsulated or encased in a suitable dielectric material. Such trench regions may include, for example, a polysilicon electrode encapsulated or encased in silicon oxide, and can be used as isolation in other devices in a High Voltage Integrated Circuit (HVIC) integration.

Figure 1:
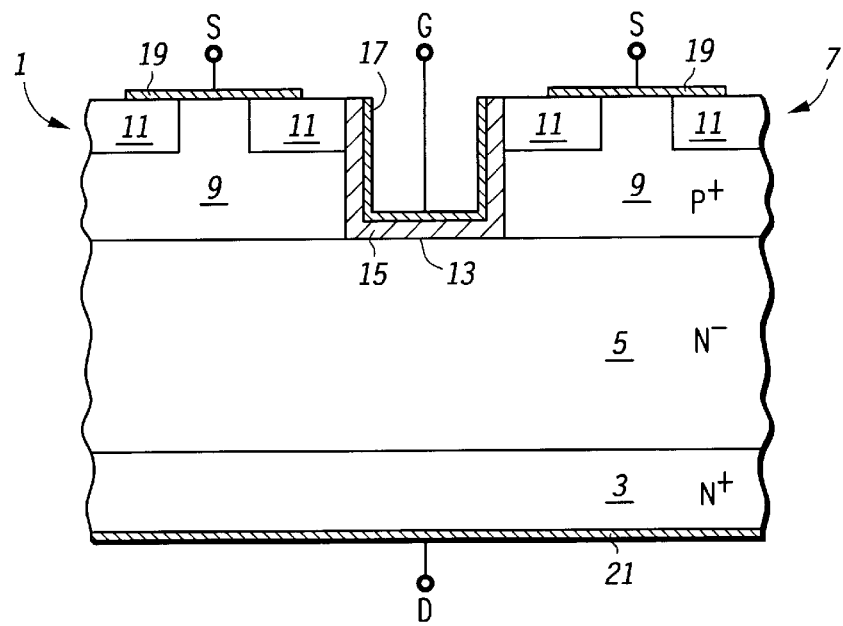
FIG. 1 is an illustrative diagram of a prior art power MOSFET device.
Figure 2:
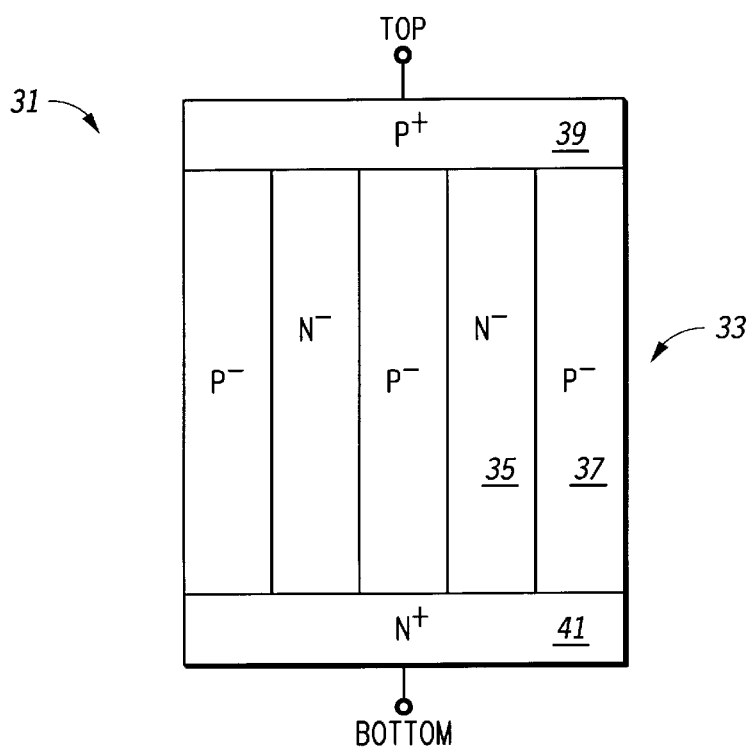
FIG. 2 is an illustrative diagram of a prior art RESURF super-junction device.
Figure 3:
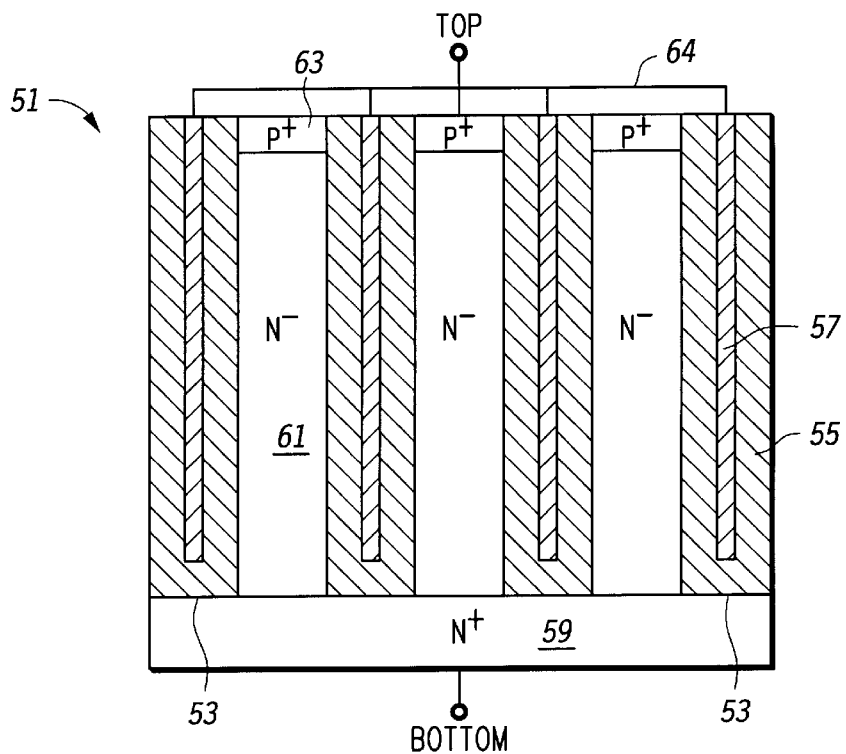

FIG. 3 illustrates one example of a trench MOS super-junction device 51 made in accordance with the teachings herein. This device is similar in some respects to the device depicted in FIG. 2. However, instead of having P− regions which alternate with N− regions as in the device of FIG. 2, in the device of FIG. 3, the P− regions have been replaced with trenches 53 which, in one particular embodiment, are lined with an oxide layer and filled with polysilicon. The trenches terminate on one end in an N+ layer 59 and are spaced apart from each other by vertically oriented N− regions 61, each of which is capped with a P+ region 63. Each of the polysilicon electrodes is in electrical contact with each other by way of conductive leads 64.

In the particular embodiment depicted in FIG. 3, the polysilicon electrodes are also shown as being shorted to the P+ region. However, it is possible in some embodiments for the electrodes and the P+ region to be electrically isolated, so long as the voltage of the P+ region is similar to that of the electrodes. FIG. 3 also depicts the P+ region as being disposed between the trenches. However, in some embodiments, the P+ region may extend laterally over the top of the electrodes.

The principles disclosed herein are applicable to a variety of power MOSFETs, including Double-diffuised MOS (DMOS) devices. DMOS devices made in accordance with the teachings herein may be either N-channel or P-channel devices, and may operate in enhancement mode or depletion mode. These devices are useful as insulated gate bipolar transistors and as high current and high voltage transistors.

Figure 4:
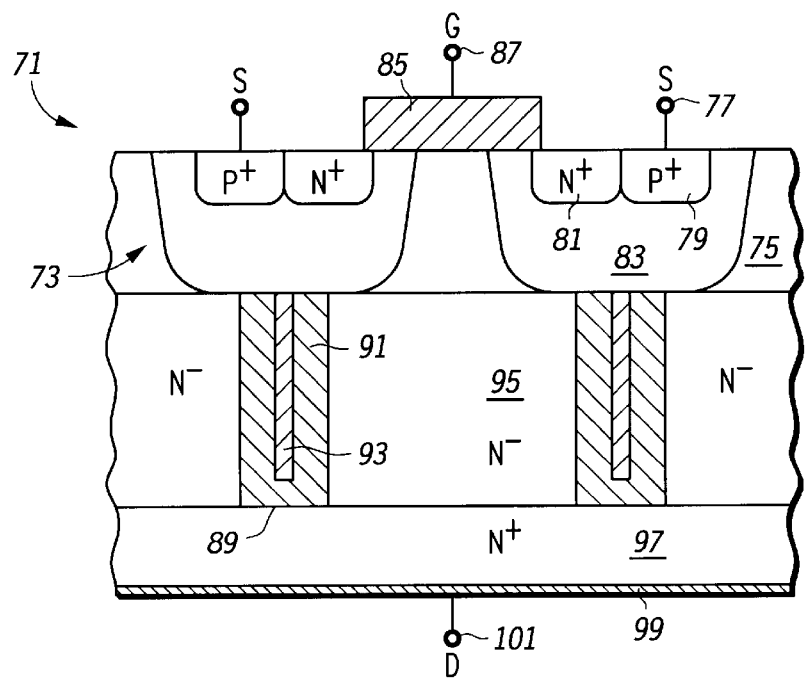
Figure 8:
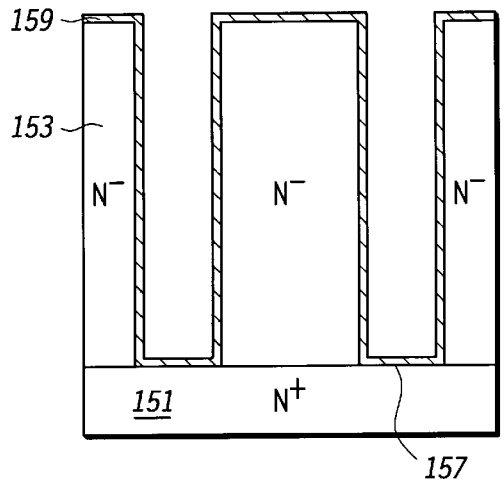
Figure 9:
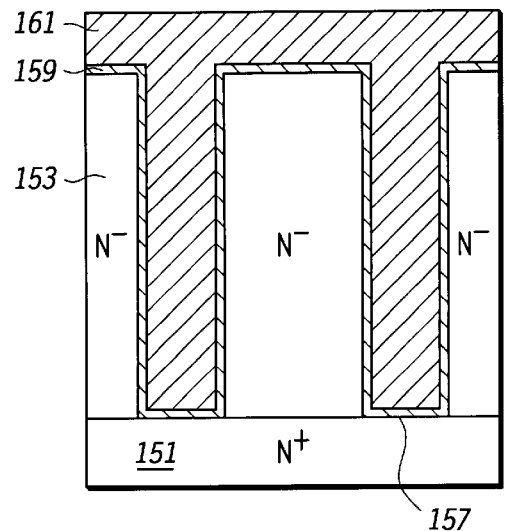
Figure 10:
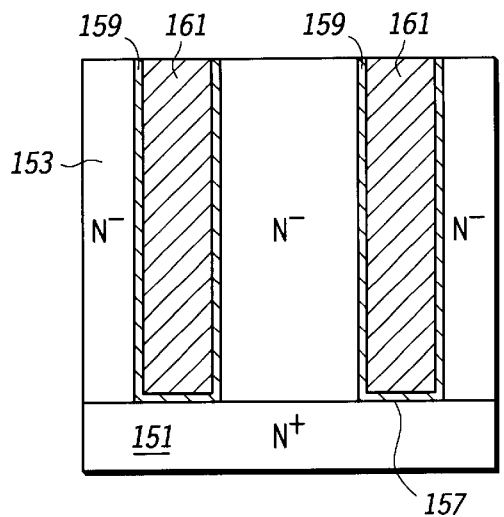

One particular, non-limiting example of a DMOS device 71 made in accordance with the teachings herein is depicted in FIG. 4. The device includes a plurality of source and body regions 73 disposed in an epitaxial layer 75. Each of the source and body regions are in electrical contact with a source and body terminal 77. In this particular embodiment, each source and body region includes a P+ region 79 and an N+ region 81 which are adjacent to each other and which are disposed in a P-body region 83. A gate 85 is provided which extends over the source and body regions. The gate is in electrical contact with a gate terminal 87.

Each of the source and body regions is disposed over a trench 89. Each trench is lined with a suitable dielectric 91 such as silicon oxide, and includes an electrode 93 made out of a suitable material such as polysilicon. The trenches are separated from one another by intervening, vertically oriented N− regions 95 which extend between the epitaxial layer 75 and an N+ substrate 97. The N+ substrate is equipped with a drain metallization layer 99 that is in contact with the drain terminal 101.

While the devices depicted in FIGS. 3 and 4 are vertical devices, the teachings herein may also be applied to the production of lateral MOSFETs, and to MOSFETS possessing a hybrid structure (that is, a device containing drift region elements that are both vertically and laterally oriented). One possible, non-limiting example of a lateral device is depicted in FIG. 5. This device 111 is similar in some respects to the device of FIG. 4. However, unlike the device of FIG. 4, the trenches 113 in the device of FIG. 5 extend laterally across the device. These trenches are bound on one side by an epitaxial layer 115 and are bound on the other side by an N+ region 117 which is in electrical contact with a drain terminal 119.

The device 111 includes a plurality of source and body regions 121 disposed in the epitaxial layer 115. Each of the source and body regions are in electrical contact with a source and body terminal 123. In this particular embodiment, each source and body region includes a P+ region 125 and an N+ region 127 which are adjacent to each other (and overlap slightly) and which are disposed in a p-body region 129. A gate 131 is provided which extends laterally over the source and body regions. The gate is in electrical contact with a gate terminal 133.

Each of the source and body regions is disposed over a trench. Each trench is lined with a suitable dielectric 135 such as silicon oxide, and includes an electrode 137 made out of a suitable material such as polysilicon. The trenches are separated from one another by intervening, laterally oriented $N^-$ regions 139 which extend between the epitaxial layer 115 and the $N^+$ region 117. The epitaxial layer 115, $N^+$ region and trenches are all disposed on a p-type substrate 130.

FIGS. 6–11 illustrate one possible fabrication sequence for a device made in accordance with the teachings herein. In accordance with this sequence, an $N^+$ substrate 151 is provided. An epitaxial layer is then grown on the substrate and is doped to result in an $N^-$ region 153 (see FIG. 6). A mask 155 is then formed over the $N^-$ region, thereby defining a masked region and an unmasked region in the $N^-$ region. The unmasked region is then etched to form a plurality of trenches 157 (see FIG. 7). After removal of the mask, a dielectric layer 159 such as silicon oxide is then deposited over the surface of the trenches (see FIG. 9), followed by polysilicon 161 deposition. The polysilicon and dielectric layer are then etched or polished back to result in the structure shown in FIG. 10, in which each of the $N^-$ regions (which collectively define the drift region of the device) are bounded on the bottom by the $N^+$ region and on each side by the dielectric layer of the trench regions. The device may be subjected to a number of further processing steps to complete the device. These may include, for example, the deposition of a $P^+$ layer over the structure of FIG. 10 and the definition of any necessary source, gate and drain metallization layers and/or source and body regions in accordance with conventional processes.

Figure 11:
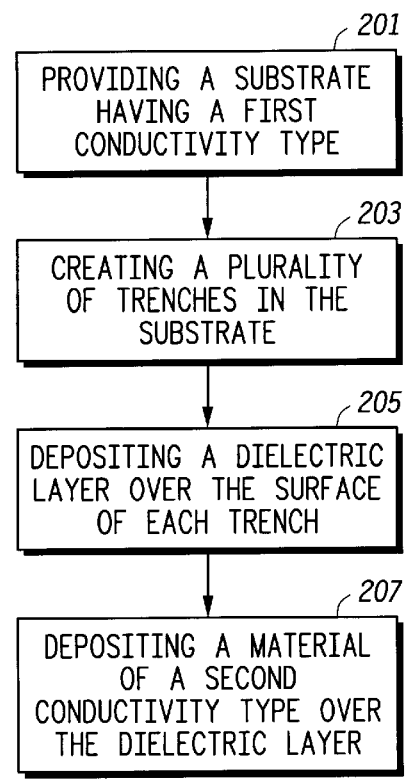
FIG. 11 is a flowchart illustrating one possible fabrication route for a RESURF super-junction device in accordance with the teachings herein.
Figure 12:
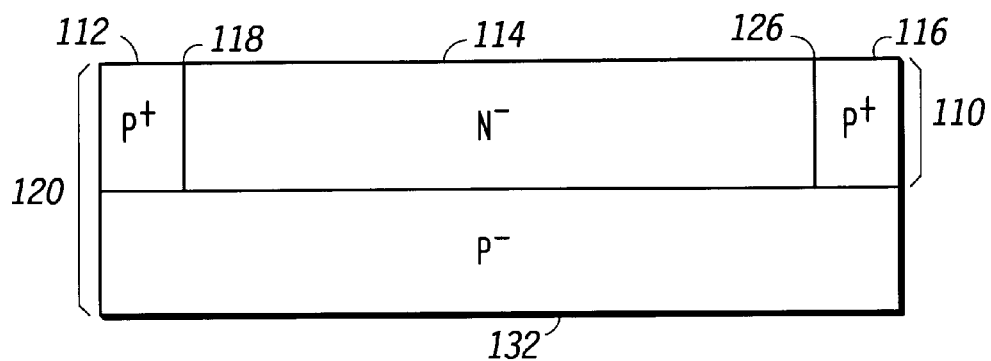
FIG. 12 is an illustrative diagram of a prior art RESURF MOSFET device.

FIG. 11 illustrates the general processing steps of a method that may be used to make a RESURF super-junction device of the type described herein (one particular embodiment of this method has been previously described with respect to FIGS. 6–10). As shown therein, the method includes the steps of providing 201 a substrate having a first conductivity type, creating 203 a plurality of trenches in the substrate, depositing 205 a dielectric layer onto the interior surface of each trench, and depositing 207 a material of a second conductivity type over the dielectric layer.

A. Conductivity Types

In some of the specific, non-limiting examples described above, devices have been disclosed in which the drift region contains materials having a particular conductivity type. However, one skilled in the art will recognize that, in many cases, useful devices can be obtained in which the conductivity type or polarity of these regions is reversed. Thus, for example, in cases noted above in which the electrode is a P-type conductor and the drift region is an N-type conductor, the conductivity type of these regions can be reversed such that the electrode is an N-type conductor and the drift region is a P-type conductor. Similarly, in devices containing source and body regions, the polarity of these regions can be reversed.

B. Materials Selection

A variety of materials may be used to make the different regions in the devices described above. For example, the conductive portion of the electrode may be made from doped or undoped polysilicon, or from various metals as are known to the art. The dielectric portion of the electrode will most typically be made from silicon oxide, but may also be made from silicon nitride and from other dielectric materials as are known to the art.

C. Doping Gradients

In the various devices described herein, the composite regions of alternating conduction type may have various doping profiles. Thus, for example, the doped polysilicon electrode and the n-regions that may be employed in the composite regions of these devices may be uniformly doped, or may have a doping gradient along one or more axes. For example, the doping profile may be such that the donor concentration in the N regions is higher near the $N^+$ region than near the $P^+$ region. Likewise, the polysilicon electrode may be doped such that the acceptor concentration in the electrode is higher near the $P^+$ region than near the $N^+$ region.

A doping profile utilized in devices of the type described herein may be the result of a single doping operation, or of multiple doping operations. Thus, for example, a given doping profile may be achieved by applying a dopant gradient over a region that has been previously doped in a uniform manner.

D. End Uses

Power MOSFET devices made in accordance with the teachings herein may be deployed in a number of applications. For example, these devices may be used in imaging devices such as scanners and printers, where they may be used, for example, in printhead and motor drivers and controls, power supplies, and linear/switch regulators; in the automotive industry, where they may be used, for example, in power train (engine and transmission) devices, airbag deployment, power window mechanisms, actuator drivers, motor drivers, lighting, high voltage multiplex wiring (MUX), safety items, and power relays; in subscriber line interfaces and other network elements; and in wireless applications and products, such as cell phones and wireless displays, where they may be used, for example, in Global Control Audio Power (GCAP) devices and in audio and power management mechanisms.

E. Device Types

The teachings herein may be applied to produce a variety of power devices. These include both vertical and lateral power MOSFETs; power bipolar devices, including high voltage diodes and high voltage power bipolar transistors; and power static induction transistors.

F. Dimensions of Region

The thickness of the trenches and the n-regions in the composite layers of devices made in accordance with the teachings herein may vary. However, since $R_{ON}$ is typically somewhat proportional to the lateral dimensions of the trenches and $N^-$ regions, it is desirable to minimize the lateral dimensions of these features within the bounds of the manufacturing technology being used so that $R_{ON}$ will in turn be minimized. It is also preferred that the area of each trench should be approximately equal to the area of each $N^-$ region (or, in a device of opposite polarity, the area of each $P^-$ region), since this will give the lowest $R_{ON}$ per unit area.

Suitable devices can be made by existing trench technology in which the trench width is within the range of about 1 to about 6 microns. The electrodes in such devices will have a width within the trench that is typically within the range of about 0.1 to about 1 microns. The dielectric layer (or layers) lining the trench will have a typical deposited thickness within the range of about 0.5 to about 3 microns. The width of the $N^-$ regions (or, as the case may be, $P^-$ regions) which collectively form the drift region may vary and, as noted above, is preferably minimized, but is typically similar in magnitude to the width of the trenches.

The height or depth of the $N^-$ regions (or, as the case may be, $P^-$ regions) may also vary. In a vertical device such as that shown in FIG. 3, the height of the $N^-$ regions determines the voltage rating of the device, and hence is driven by the end use for which the device is designed. However, the voltage ratings required by most common applications dictate a height for this region that is within the range of about 4 to about 20 microns. The depth of the electrode will typically be approximately equal to the height of each $N^-$ region. In lateral devices, the length of the $N^-$ regions does not typically have any direct bearing on the voltage rating of the device, but is preferably within the range of about 5 to about 8 microns, and the length of the electrode will typically be approximately equal to the length of each $N^-$ region.

G. Other Layers or Regions

As noted above, the super-junction devices described herein contain alternating or interdigitated sequences of regions having opposite conductivity types, such as polysilicon/oxide trenches and $N^-$ regions. However, these regions may also contain certain other intervening layers or regions, including, for example, additional dielectric layers.

Moreover, the regions of opposite conductivity type may or may not be co-continuous or co-extensive in the vertical or horizontal direction. Thus, for example, one or more portions of the drift region may be replaced with regions having a different conductivity type or polarization. Thus, for example, portions of the $N^-$ region in these devices may be replaced with $P^+$ or $N^+$ regions.

H. Geometry

For the sake of convenience, the geometry of the electrodes and drift regions in the devices described herein have been depicted as being rectangular in cross-section. However, various devices may be made in accordance with the principles disclosed herein in which these regions have various other cross-sectional shapes, including, but not limited to, circular, elliptical, irregular, or various polygonal shapes, such as, for example, square, trapezoidal or hexagonal.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A RESURF super-junction device, comprising:

an alternating sequence of first and second regions; wherein each of said first regions comprises a first material having a first conductivity type, wherein each of said second regions comprises a trench containing a second material having a second conductivity type which is separated from the first material by a dielectric layer, and wherein said first regions collectively define a drift region for the device.

2. The device of claim 1, wherein the first and second materials have N type and P type conductivity, respectively.

3. The device of claim 2, wherein the second material comprises polysilicon.

4. The device of claim 1, wherein the dielectric layer comprises silicon oxide.

5. The device of claim 1, wherein the drift region is bounded on one end by a $P^+$ region, and is bounded on the other end by an $N^+$ region, and wherein each trench extends from the $P^+$ region to the $N^+$ region.

6. The device of claim 1, wherein each of said second regions comprises an electrode.

7. The device of claim 1, wherein said device is a vertical MOSFET.

8. The device of claim 1, wherein said device is a lateral MOSFET.

9. The device of claim 1, wherein one end of each trench is adjacent to a source and body region.

10. A RESURF super-junction device, comprising:

a $P^+$ region;

an $N^+$ region; and a drift region, disposed between said $P^+$ region and said $N^+$ region, said drift region comprising a plurality of regions of a first conductivity type; wherein any two of said plurality of regions have at least one trench disposed between them which contains a conductive material and a dielectric material.

11. The RESURF super-junction of claim 10, wherein said plurality of regions are $N^-$ regions.

12. The RESURF super-junction of claim 10, wherein said plurality of regions are P-regions.

13. The RESURF super-junction of claim 10, wherein the at least one trench comprises a plurality of trenches, and wherein any two of said plurality of trenches has at least one $P^+$ region disposed between them.

14. The RESURF super-junction of claim 10, wherein the at least one trench comprises a plurality of trenches, and wherein any two of said plurality of trenches has at least one $N^-$ region disposed between them.

15. The RESURF super-junction of claim 10, wherein the conductive material is electrically coupled with at least one source and body region.

16. The RESURF super-junction of claim 10, wherein the conductive material is polysilicon, and wherein the dielectric material is silicon dioxide.

* * * * *